(12) United States Patent
Hussaini et al.

(10) Patent No.: US 7,483,272 B2
(45) Date of Patent: *Jan. 27, 2009

(54) PORTABLE HAND HELD MULTI-SOURCE POWER INVERTER WITH PASS THROUGH DEVICE

(75) Inventors: Saied Hussaini, Miami Gardens, FL (US); Marc Iacovelli, Miami Gardens, FL (US)

(73) Assignee: Intec, Inc., Miami Gardens, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/808,780

(22) Filed: Jun. 12, 2007

(65) Prior Publication Data

US 2008/0024009 A1 Jan. 31, 2008

Related U.S. Application Data

(63) Continuation of application No. 11/591,529, filed on Nov. 2, 2006, now Pat. No. 7,298,627, which is a continuation-in-part of application No. 10/795,217, filed on Mar. 9, 2004, now Pat. No. 7,272,008, application No. 11/808,780, filed on Jun. 12, 2007, which is a continuation-in-part of application No. 29/261,268, filed on Jun. 12, 2006, now Pat. No. Des. 544,439, and a continuation-in-part of application No. 29/193,755, filed on Nov. 14, 2003, now Pat. No. Des. 495,296.

(51) Int. Cl.
*H05K 5/00* (2006.01)
(52) U.S. Cl. .......................... 361/704; 174/50; 363/146
(58) Field of Classification Search ................. 361/704; 174/50; 363/146
See application file for complete search history.

(56) References Cited

U.S. PATENT DOCUMENTS

| 5,170,067 | A | | 12/1992 | Baum et al. |
| D343,395 | S | | 1/1994 | Kakizaki |
| D349,682 | S | | 8/1994 | Hunziker |
| 5,742,478 | A | * | 4/1998 | Wu ............................ 361/704 |
| D409,139 | S | | 5/1999 | Cornell et al. |
| 5,949,640 | A | * | 9/1999 | Cameron et al. ............ 361/600 |
| D427,146 | S | | 6/2000 | Wei |

(Continued)

FOREIGN PATENT DOCUMENTS

JP 93921 9/1991

*Primary Examiner*—Dean A. Reichard
*Assistant Examiner*—Andargie M Aychillhum
(74) *Attorney, Agent, or Firm*—Berenato, White & Stavish, LLC

(57) ABSTRACT

A portable hand held power inverter/converter having a pass through device for simultaneously sourcing A.C. and multiple voltage D.C. power consuming devices through a single D.C. power source connection. Inverter and converter circuitry is provided to invert and convert D.C. voltage to an A.C. voltage source and a lower DC voltage. A.C. electrical outlets are provided to facilitate a connection to an external A.C. power-consuming device and a DC outlet to a lower volt DC power-consuming device. The pass through device provides an independent and simultaneous connection to an additional D.C. outlet that would otherwise be eliminated when occupied by the inverter thus allowing simultaneous connection and operation of both A.C. and multi source D.C power consuming devices through a single external D.C. power outlet of a single D.C. power source.

36 Claims, 11 Drawing Sheets

U.S. PATENT DOCUMENTS

| | | |
|---|---|---|
| D427,147 S | 6/2000 | Wei |
| D427,969 S | 7/2000 | Wei |
| D436,918 S | 1/2001 | Matsuda |
| 6,433,274 B1 * | 8/2002 | Doss et al. .................... 174/50 |
| D465,781 S | 11/2002 | Fischer |
| D469,400 S | 1/2003 | Shor et al. |
| D480,054 S | 9/2003 | Schwimmer |
| D482,654 S | 11/2003 | Shor et al. |
| D494,542 S | 8/2004 | Hriscu et al. |
| D495,296 S | 8/2004 | Hussaini et al. |
| 7,046,535 B2 * | 5/2006 | Rodriguez et al. .......... 363/146 |
| D544,439 S | 6/2007 | Hussaini et al. |
| 7,298,627 B2 * | 11/2007 | Hussaini et al. ............. 361/753 |
| 7,338,328 B2 | 3/2008 | Krieger et al. |
| 2003/0205596 A1 | 11/2003 | Ling |

* cited by examiner

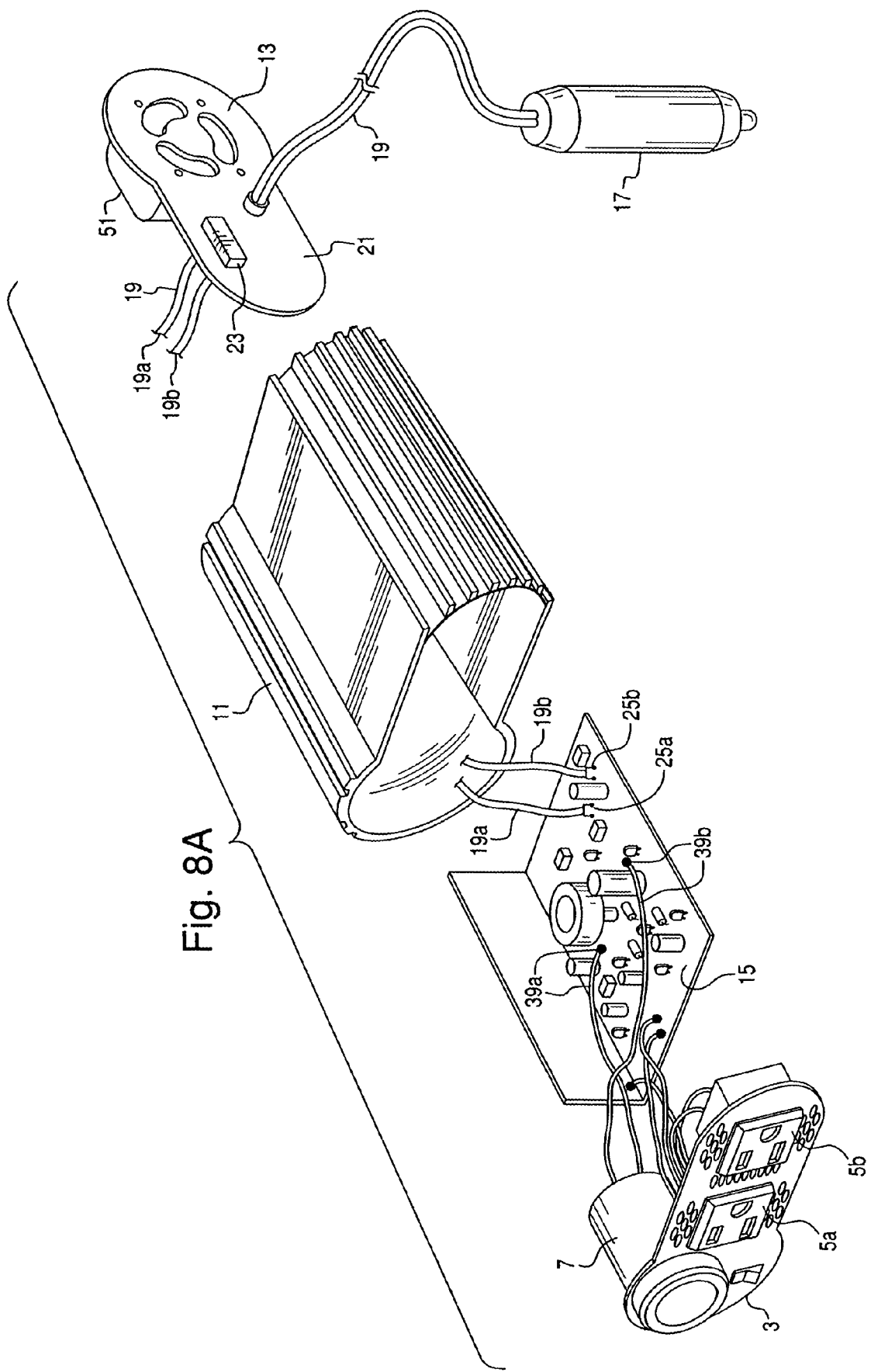

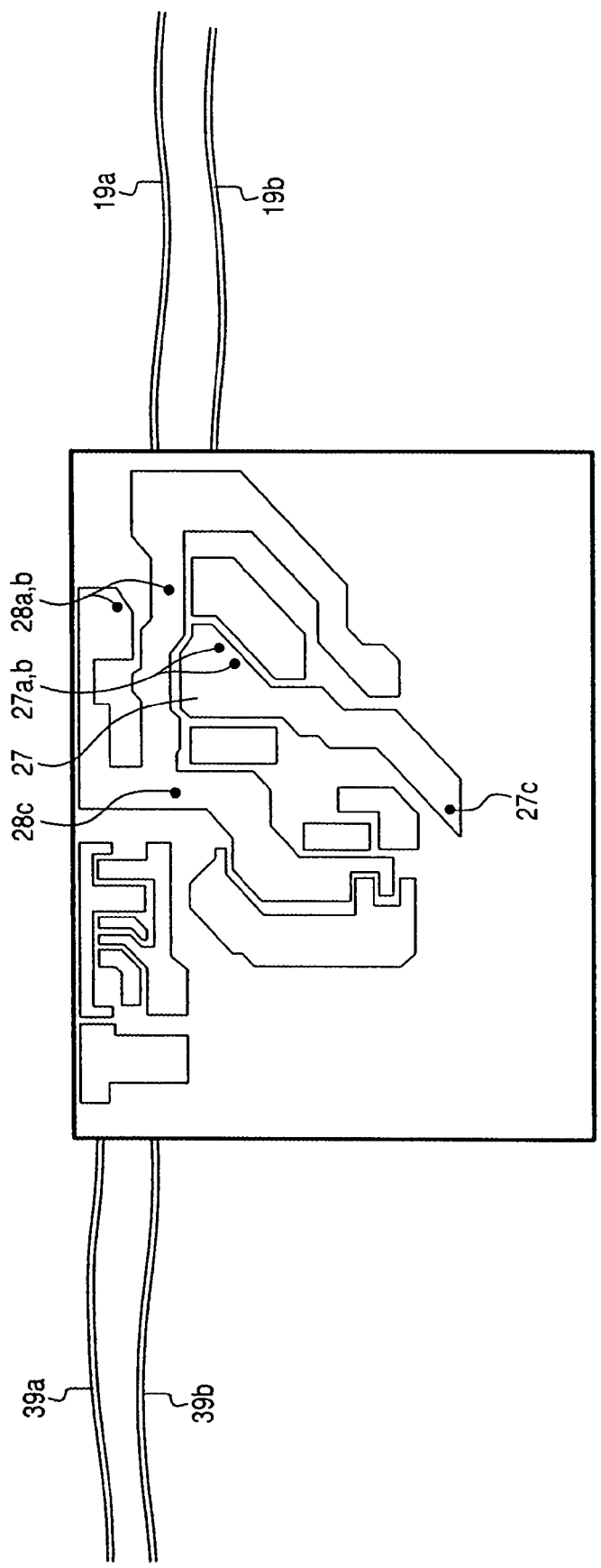

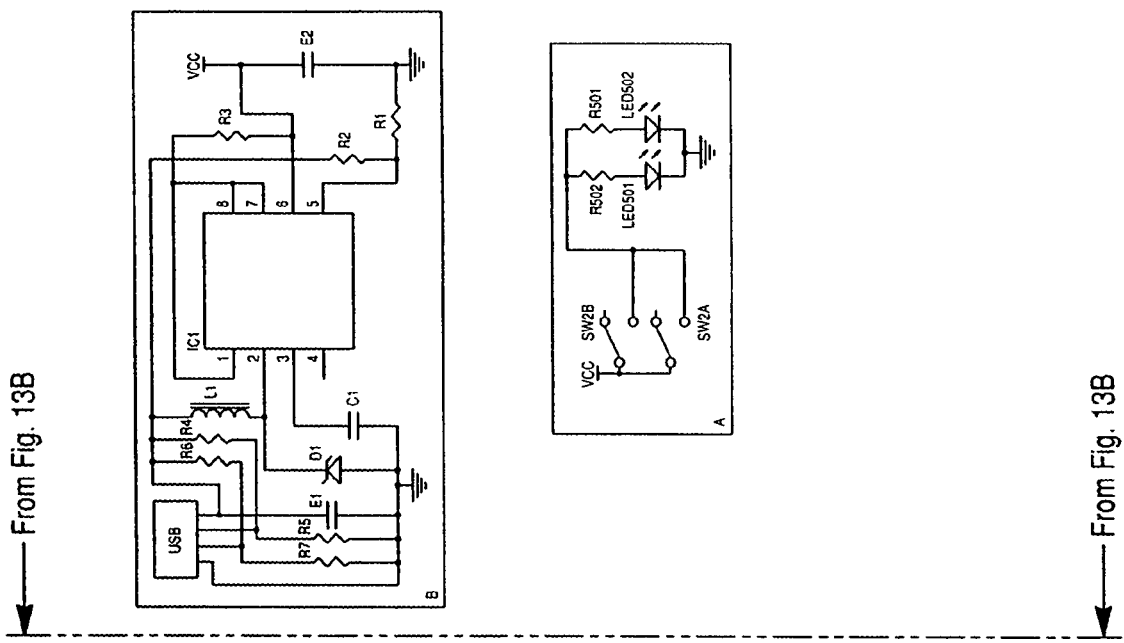

PORTABLE HAND HELD MULTI-SOURCE POWER INVERTER WITH PASS THROUGH DEVICE

The present invention is a Continuation application of U.S. Ser. No. 11/591,529 filed on Nov. 2, 2006 now U.S. Pat. No. 7,298,627 which is a continuation-in-part application of U.S. Ser. No. 10/795,217 filed on Mar. 9, 2004 now U.S. Pat. No. 7,272,008. The present invention is also a continuation-in-part application of U.S. Ser. No. 29/261,268 filed on Jun. 12, 2006 now U.S. Pat. No. D,544,439; and U.S. Ser. No. 29/193,755, filed Nov. 14, 2003 now U.S. Pat. No. D495,296, each of which are incorporated herein by reference.

BACKGROUND OF THE INVENTION

1. Field of the Invention

The invention is related to a power inverting device and more particularly to a portable power inverting device having a pass through device for connection and operation of both A.C. and D.C. power consuming devices to a single outlet of a single power source.

2. Background of the Related Art

Portable power inverter devices are well known in the art. These devices often provide a source of A.C. electrical power to run A.C. devices when in an environment where only a D.C. voltage source is available such as in an automobile. Power inverters provide the ability to power A.C. consuming devices when only such D.C. power sources are available. Examples of such power inverters are disclosed in the following U.S. patents, each of which are herein incorporated by reference: U.S. Pat. Nos. 6,411,514; 5,742,478; and 5,170,336. However, while these and other prior art inverters are connected to the D.C. power source, that connection/D.C. source is no longer useable while the inverter is connected.

SUMMARY OF THE INVENTION

The present invention is directed to a portable power inverter having a housing enclosing power inverting circuitry. An electrical connector connects the housing to an external D.C. voltage source. The circuit assembly supported within said housing is electrically coupled to the external D.C. power source. The circuit assembly includes inverter circuit equipped with electrical components for inverting the supplied D.C. voltage to an A.C. voltage source. A.C. electrical outlets are provided to facilitate a connection to an external A.C. power consuming device. A pass through device provides an independent and simultaneous connection to an additional D.C. outlet to allow connection of an external D.C. power consuming device. The pass through device allows connection of D.C. consuming devices that would otherwise be connected directly to the external D.C. power source while the inverter is so connected thus allowing connection and operation of both A.C. and D.C power consuming devices through a single external D.C. power outlet of a single D.C. power source.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein:

FIG. 8a is an exploded view of the power inverter according to the present invention.

FIG. 8b is an isolated view showing a rear side portion of the printed circuit board.

DESCRIPTION OF THE PRESENT INVENTION

Figure 1:
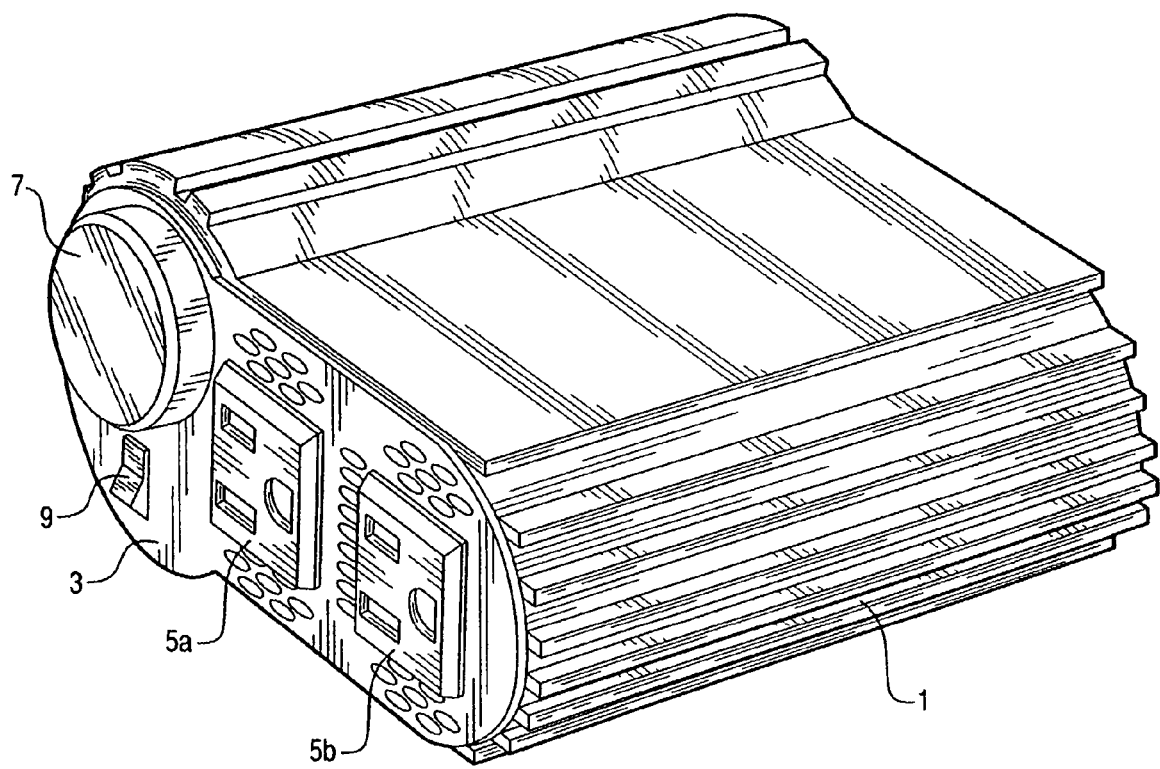
FIG. 1 is a perspective view of the Power Inverter according to the present invention.
Figure 2:
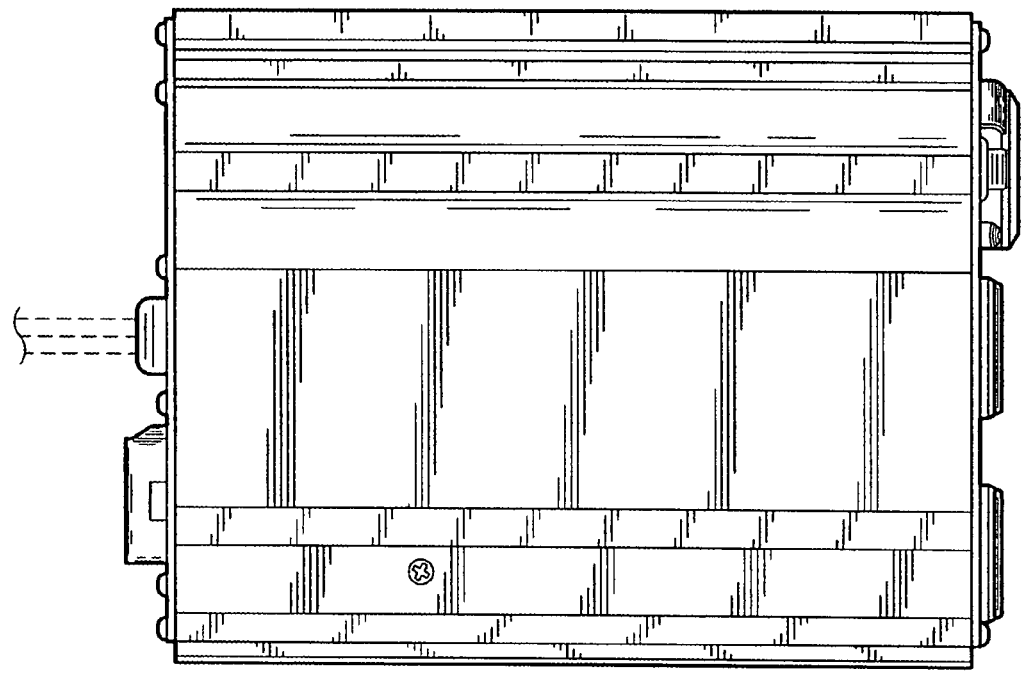
FIG. 2 is a bottom side view of the Power Inverter of FIG. 1.
Figure 3:
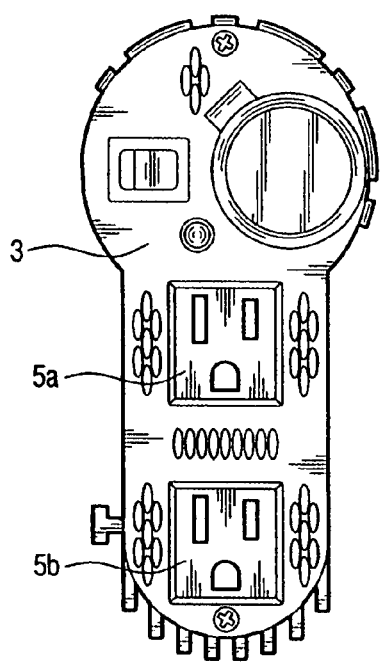
FIG. 3 is a front side view of the Power Inverter of FIG. 1.
Figure 4:
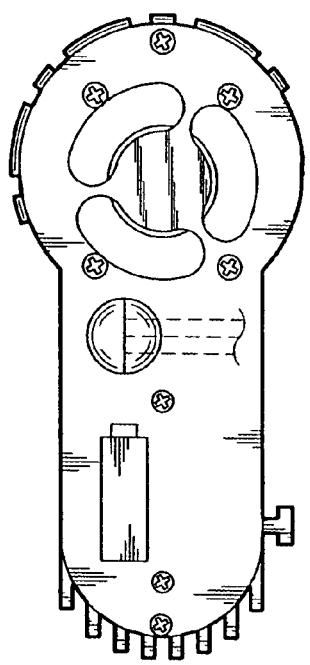
FIG. 4 is a back side view of the Power Inverter of FIG. 1.
Figure 5:
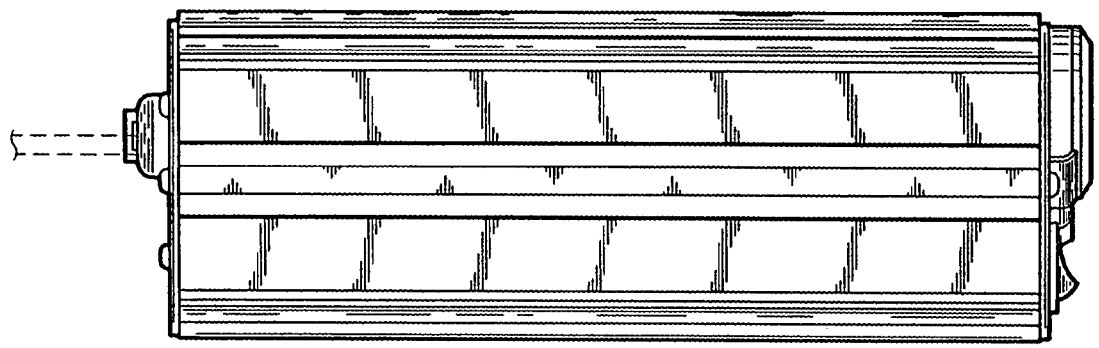
FIG. 5 is a left side view of the Power Inverter of FIG. 1.
Figure 6:
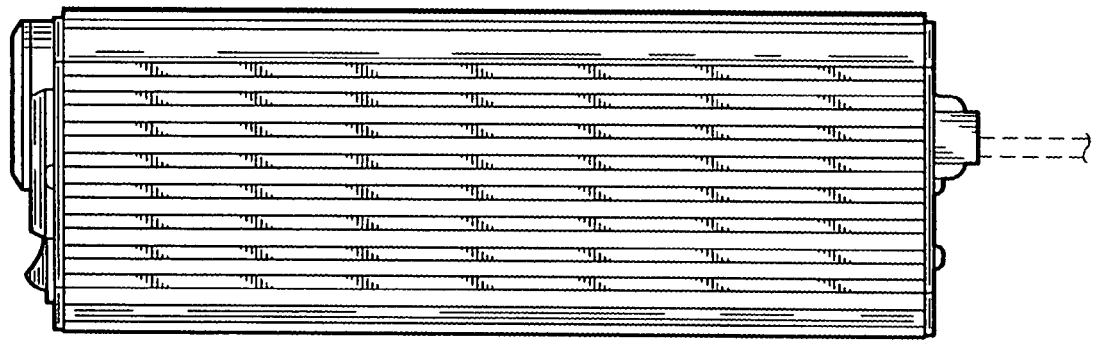
FIG. 6 is a right side view of the Power Inverter of FIG. 1.
Figure 7:
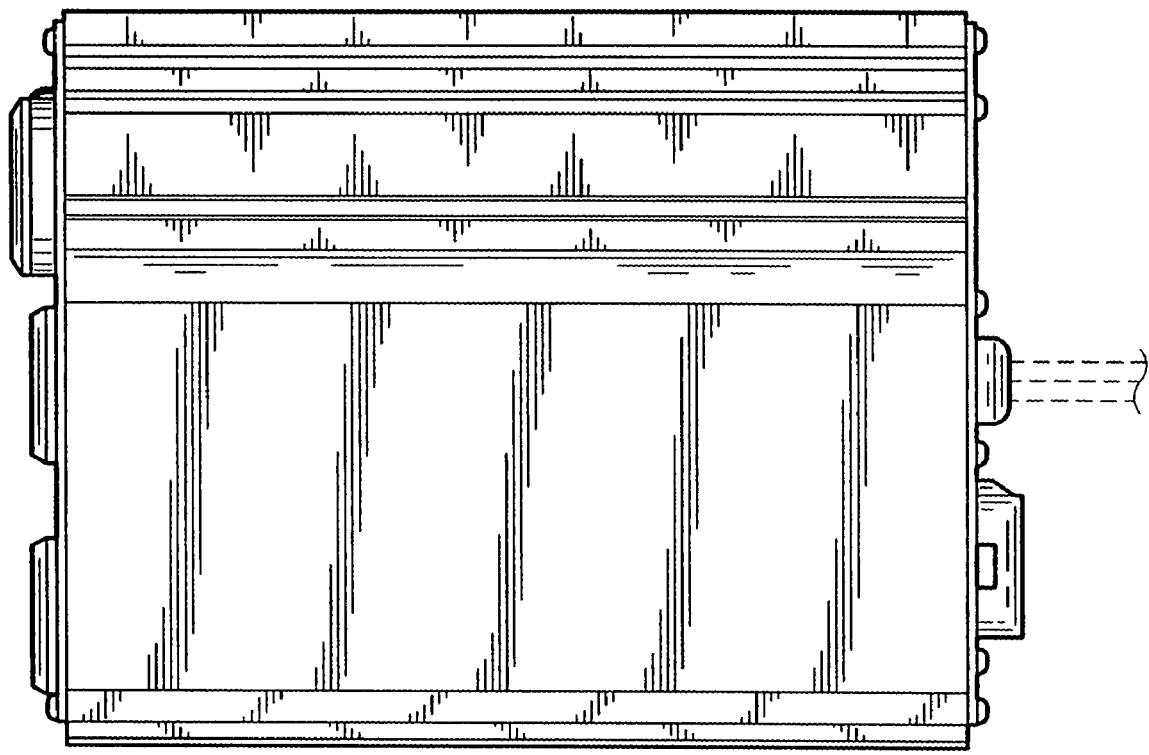
FIG. 7 is a top side view of the Power Inverter according to the present invention.

FIG. 1. depicts a perspective view of the power inverter according to the present invention. FIGS. 2-7 depict the six side views of the inverter of FIG. 1. A housing 11 made of aluminum or other suitable hard material encloses much of the working components of the inverter 1 with a pair of end plates 3, 13 form to enclose the housing. The housing 11 has a substantially flat bottom portion in order that the inverter 1 may rest on a surface, a flat top portion opposite the flat bottom portion, and a pair of opposite side walls 12, 13, whereby at least wall is formed with parallel grooves 12a extending a length of the housing. The parallel grooves being disposed adjacent to parallel ridges 12b disposed next to the grooves side along an entire height 'h' of the housing to thereby define a side wall with a grooved configuration. The embodiment of FIG. 1 has horizontal ridges/grooves, while the embodiment of FIG. 9-12 has vertical ridges/grooves 112a, 112b. In addition to the fan 51 described below, these ridges and grooves may help to dissipate heat generated by the inverter 1. As shown in FIG. 1, the end plate 3 has multiple outlets; two A.C. outlets 5a, 5b, a D.C. outlet 7 and a power switch 9. The D.C. outlet represents a pass-through outlet to maintain an available D.C. power source and will be discussed in further detail below.

FIG. 8a depicts an exploded view of the inverter of FIG. 1 exposing the essential working components. It is first to be understood, that power inverters for converting a 12 volt power source to an available 110 volt A.C. source is old and well known in the art. Conventionally, these components are mounted on a printed circuit board such as shown in FIG. 8a. The printed circuit board has the essential components to convert a 12-volt power source for running an A.C. current consuming device. Such off the shelf circuitry is readily available to one of ordinary skill in the art. Thus no further details regarding the component circuitry or details regarding power inverting in general need to be discussed in further detail. Any power inverting circuitry for inverting 12 volts to A.C. voltage to run an A.C. consuming device may be employed. It is also understood the inverter circuitry can be designed for various power ratings over a range of watts. For example, a small 100 watt power inverter may be desirable for extreme portability to power low power consuming A.C. devices such as a clock or radio. The wattage rating may be increased to exceed 1000 watts depending on the intended application for the inverter. Such arrangements are well known in the art and are readily available. The present invention is primarily directed to the arrangement of power inverter components employing a pass through device to maintain the availability of the 12-volt source which powers the inverter. Thus the remaining discussion will be directed to such an arrangement.

As previously mentioned, the present invention includes two A.C. outlets 5a, 5b mounted on the end plate 3. The outlets 5a, 5b are intended to power two different A.C. consuming devices by inverting a 12 volt (or other low voltage D.C. source) to A.C. Such a D.C. voltage source is often found in automobiles. For such use, the present invention includes a male plug type cigarette electrical connector 17 for insertion into a female cigarette outlet commonly found in automobiles as well as other 12-volt power sources. Power leads (positive and ground) 19 extend from the male plug 17 through a rear end plate 21 to connect the D.C. voltage source to the printed circuit board 15. The power leads may first pass through a fuse box 23 prior to connecting to printed circuit board 15 as is conventionally known in the art.

The power leads 19 include a positive lead 19a and ground lead 19b which are connected/soldered to corresponding points on the printed circuit board 15. Preferably the leads 19a, 19b are connected via removable connectors 25a, 25b which extend through the printed circuit board and are soldered to corresponding positive lines 27/28 at two points 27a,27b and 28a,28b to ensure a secure connection to the circuit board. Thus the leads 19 bring power from an external D.C. voltage source to the inverter circuitry. The A.C. outlets 5a,5b are connected to corresponding points on the printed circuit board as is conventional in the art and generally depicted in FIG. 8a. As the connection and supply of A.C. current to A.C. outlets in an inverter is well within the knowledge of one of ordinary skill in the art, no further elaboration is necessary.

As previously discussed, it is desirable to make available a D.C. receptacle outlet to maintain a D.C. power source otherwise occupied by male plug 17. Thus the inverter of the present invention includes a pass through device to maintain the availability of a D.C. outlet while the inverter is connected to the external D.C. power source. The present invention includes a female cigarette plug type outlet 7 disposed on end plate 3 adjacent A.C. outlets 5a, 5b. The D.C. outlet 7 is comprised of a common female receptacle as commonly employed as cigarette lighters in vehicles. The female outlet 7 is correspondingly dimensioned to accommodate the male plug 17 connecter and thus mirrors the female socket of the external D.C. voltage source to which the male plug 17 is normally connected.

To power the D.C. female outlet 7, a positive lead 39a is connected through the printed circuit board and connected to positive line 27 at point 27c as shown in FIGS. 8A & 8B. Similarly ground line 39b extends from the female outlet 7 through the printed circuit board 15 and is connected to ground line 28 at point 28c. Thus the female outlet 7 draws current directly from external D.C. power source in parallel to the inverter circuitry. Such an arrangement facilitates simultaneous use of the A.C. outlets and the D.C. outlet to the extent the load is not excessive relative to the rating of the external D.C. voltage source to which the inverter is connected. Should the load exceed a predetermined value, the fuse 23 would open the circuit isolating the inverter circuitry and female D.C. outlet 7 from the power source.

Thus the present invention provides a compact portable arrangement for inverting a D.C. voltage source to power an A.C. consuming device and incorporate a pass through device to simultaneously maintain the availability of a D.C. power source. The inverter unit effectively provides outlets to run both A.C. power consuming devices as well as D.C. power consuming devices simultaneously without having to make or break any connection between the inverter and original external D.C. power source.

To further enhance the performance of the inverter circuitry, each end plate are provided with ventilation holes to allow air to pass through the housing 11 and cool the electrical components during use. A fan 51 may also be employed to positively force air through the housing and may be connected to the inverter assembly as is commonly known in the art.

Figure 9:
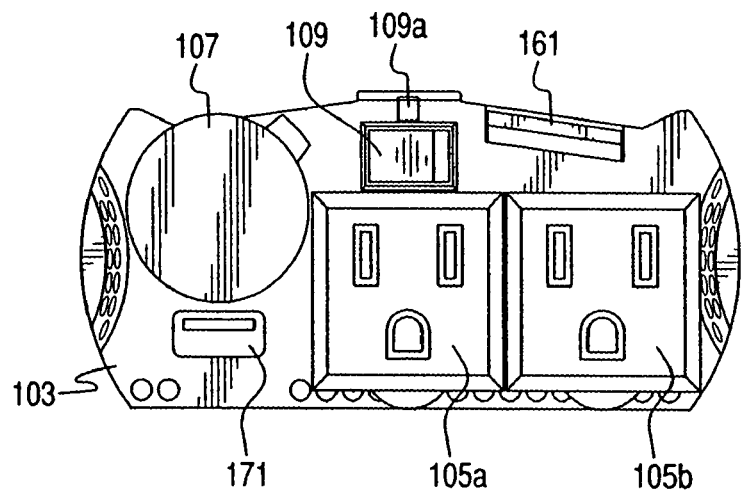
FIG. 9 is a front view of the Power Inverter according to an alternate embodiment.
Figure 10:
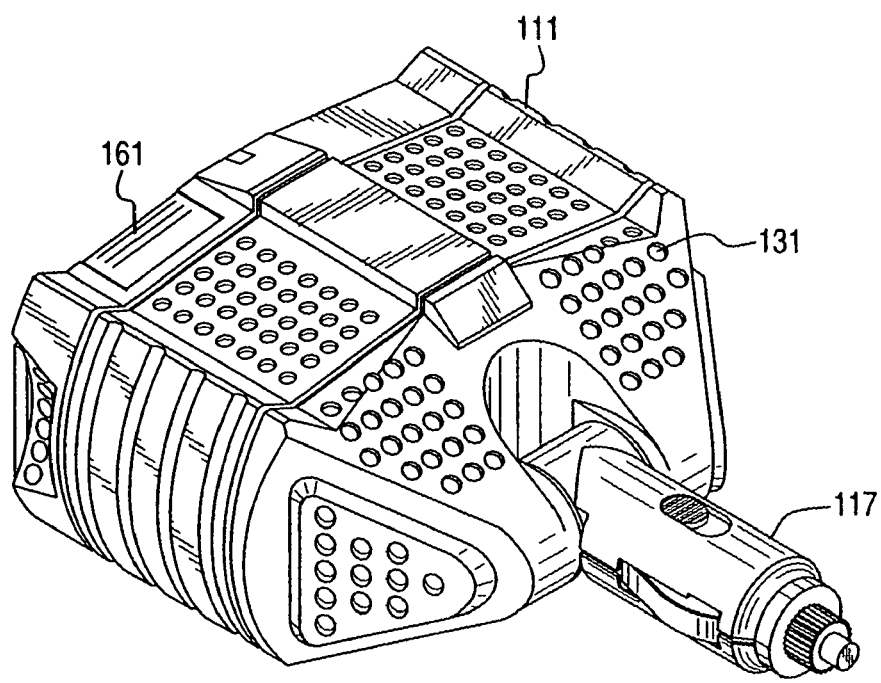
FIG. 10 is a top perspective view of the Power Inverter of FIG. 9.
Figure 12:
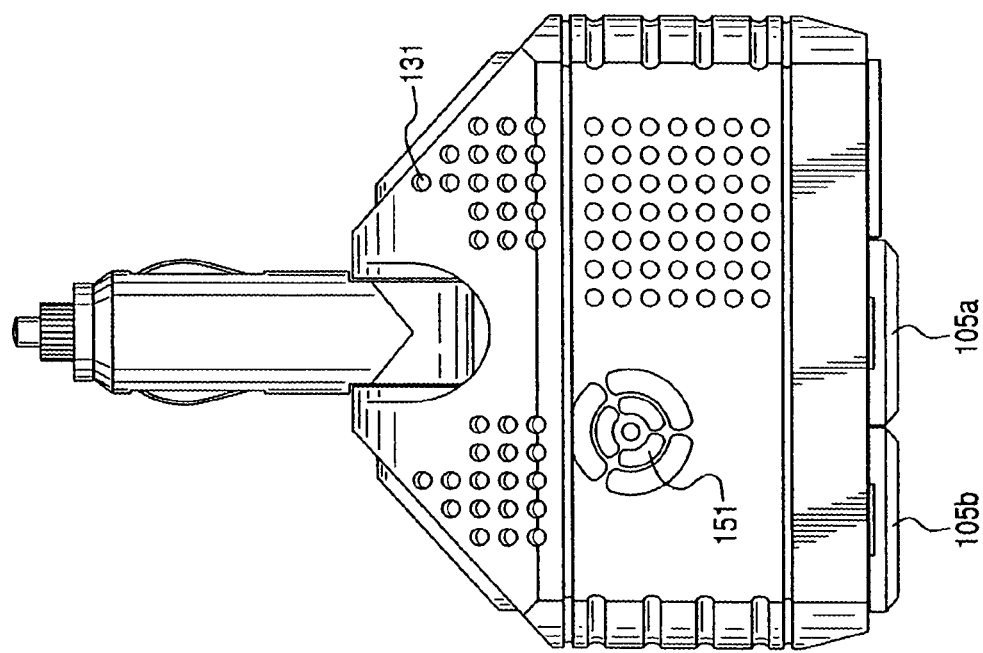
FIG. 12 is a bottom view of the Power Inverter of FIG. 9.
Figure 11:
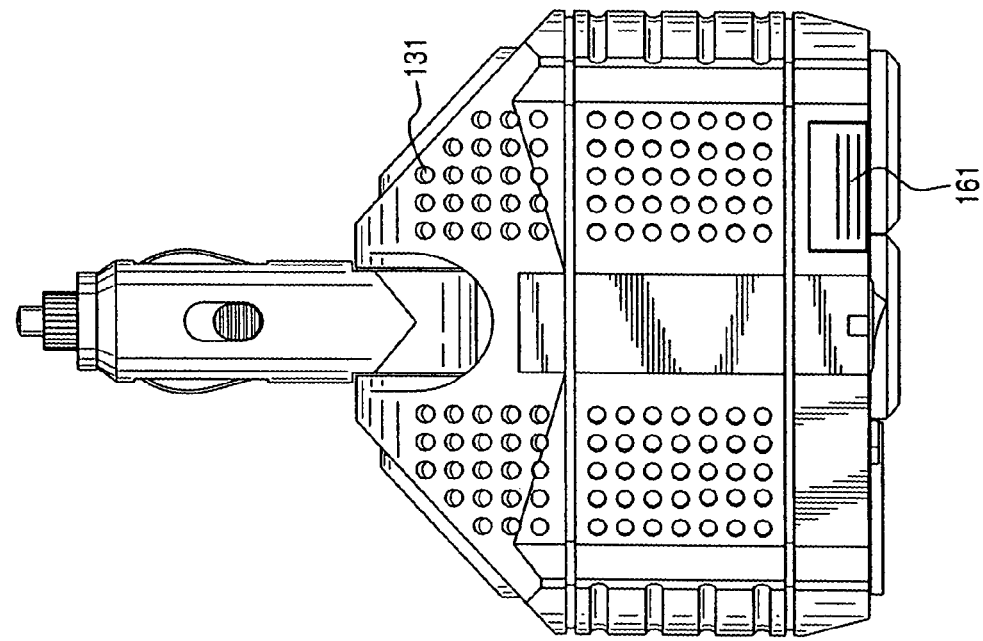
FIG. 11 is a top side view of the Power Inverter of FIG. 9.
Figure 13A:
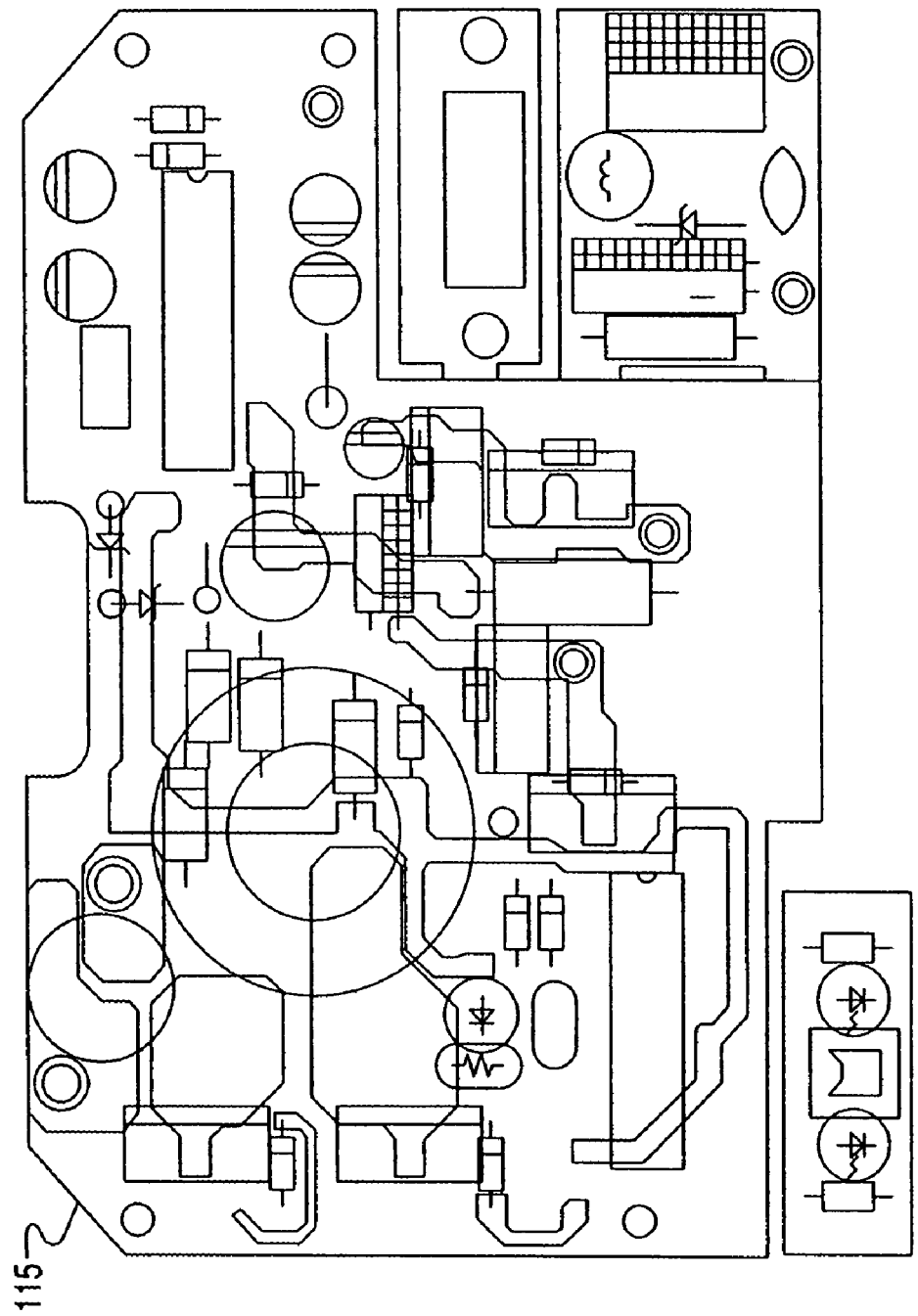
FIG. 13A is a top view of the printed circuit board of the Power Inverter of FIG. 9.
Figure 13B:
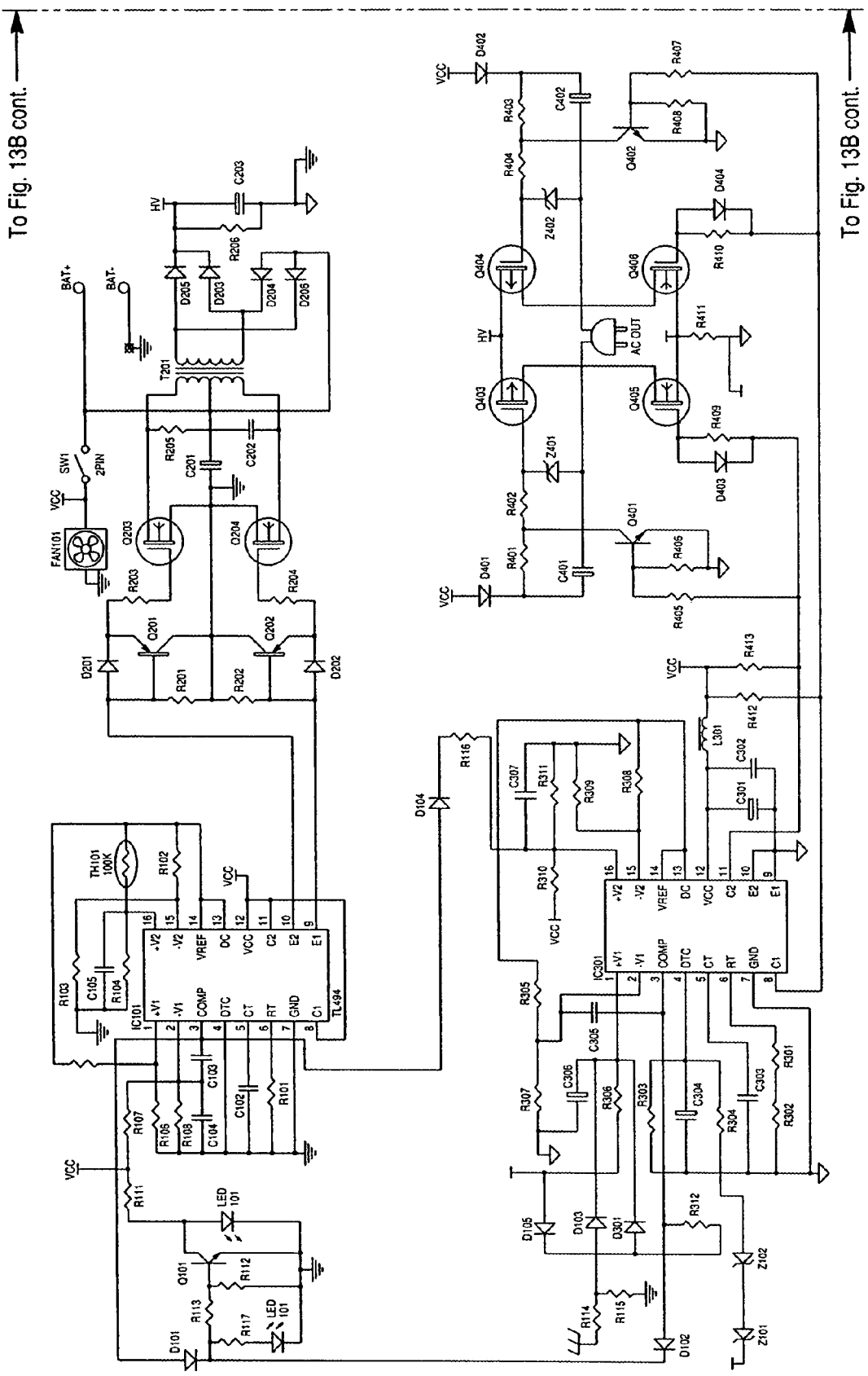
FIG. 13B is a schematic representing the circuitry of the power inverter of FIG. 9.

FIGS. 9-13 represent an alternate embodiment of the present invention. The power invert of FIG. 9 is nearly identical to the power inverter shown and described in FIGS. 1-8 including all of its functional features. The power inverter includes internal circuitry to convert DC 12 volt source to alternative current (AC) and provides two AC outlets 105a 105b as well as a DC Power Source pass through device 107 just as in the previous embodiment. A fan 151 is also included disposed adjacent the bottom side of the device 111 as well as ventilation holes 131 to facilitate circulation of cooling air to enhance heat dissipation from the device. The unit 111 includes a compact portable hand holdable housing 111 and includes a cigarette lighter style male connector 117 to plug into a corresponding female socket just as in the previous embodiment. A power switch 109 is also included, with a status indicator LED light 109a. The switch 109 is selectively positioned between an on an off position to selectively control power delivered to the AC outlets. These features have already been described in the previous embodiment and need not be elaborated further. All of the features shown and described in the previous embodiment of FIG. 2 1-8 are included in the present embodiment shown in FIGS. 9-13.

The present embodiment of FIGS. 9-13 includes at least two additional features. On the one hand the unit incorporates a map light to provide illumination adjacent the compact inverter device 111. The present invention is adapted to be simply plugged into and supported by an in-vehicle-dash DC 12 socket. The use of the present invention in such a vehicle dash is often in low light settings such as during night time driving. The map light affords the ability to provide a passenger the ability to illuminate an area that does not distract a driver such as overhead cabin lighting when the inverter is disposed in the dash 12 volt outlet. Integration of a map light into the hand held inverter device provides illumination adjacent the device to facilitate making a connection between the inverter and power consuming device in low light settings. The light 161 includes a clear/translucent spring biased switch plate. The switch plate 161 is simply depressed between an on and off position. Depressing the switch 161 overrides a small spring and catches on a retaining device in a lowered position and makes contact to close the circuit to an underlining light, preferably and LED. The clear translucent nature of the switch plate 161 allows the light to emanate from the switch plate 161 and provide illumination adjacent the front side of the inverter 111. When the switch 161 is subsequently depressed, the circuit opens and the switch plate 161 returns to its upright most/off position. Such lights, in and of them selves, are readily available in the market and well understood to those of ordinary skill in the art. The Power inverter housing 111 is simply molded to accommodate such a switched light 161 to facilitate easy assembly into the housing 111. The electrical connection between the light/switch 161 and internal circuitry will be easily recognized to one of ordinary skill in the art and is further shown in the schematic representation of the electronic circuitry in FIG. 13B.

The inverter of the present invention also includes an additional outlet 171 for powering additional DC devices of lower voltage. An additional DC outlet (in additional to the 12V DC pass through device) is also include to power lower level voltage drawing devices such as small hand held video games. Preferably a USP port connection 171 (such as that shown in FIG. 9) is included and is shown in FIG. 9. This USB connection 171 provides the ability for external devices to connect to the power inverter/converter to additional supply lower voltage DC power to either run such devices or recharge batteries in these hand held devices. Thus because such devices usually require lower voltages (of the order of 5 volts) a converter is also included in the circuitry to convert 12 volts to 5 volts and to maintain the voltage between 4.75-5.25 volts. Thus the power inverter/converter of the present invention includes not only a DC/AC inverter, but a 12 volt DC pass through outlet and converting circuitry to additionally provide lower voltage DC power through a USP port. The combination of a power inverter to provide a Source of AC power through conventional AC outlets with a pass through device to maintain the ability to connect to the 12 Volt source which powers the inverter as well as a converter to additionally provide a lower voltage source of DC power is void in the prior art.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains. For example, only a portion of the printed lines are depicted in FIG. 8B sufficient to demonstrate the connection of lead lines 19 to the circuit as well as the connection of the D.C. receptacle to appropriate lines on the board. Other printed circuitry arrangements may be employed to facilitate a parallel connection between the D.C. outlet and inverting circuitry.

What is claimed is:

1. A multi source hand held power converter device comprising:
   a compact hand holdable housing; said compact hand holdable housing in having;
      a first electrical connector for connecting said inverter to a first external D.C. voltage source;
      a circuit assembly supported within said housing and electrically coupled to said first electrical connector to facilitate a connection to said first external D.C. power source, said circuit assembly comprising an inverter circuit equipped with electrical components for inverting said first external D.C. voltage source to an A.C. voltage source and an additional converter circuitry to convert said first external DC voltage source to a second lower voltage DC power source;
      an A.C. electrical outlet connected to said housing provided to facilitate a connection to an external A.C. power consuming device, said A.C. electrical outlet being powered by said A.C. voltage source when said first electrical connector is connected to said external D.C. power source;
      a DC electrical outlet connected to facilitate a connection to an external DC power consuming device, said DC electrical outlet being connected to and powered by said second lower voltage DC power source from said converter circuitry; and
      a pass through device having a pass through D.C. electrical outlet to facilitate a connection to and providing said first external D.C. voltage source to an external D.C. power consuming device when said first electrical connector is connected to said external D.C. power source, wherein said A.C. electric outlet, said pass through D.C. electrical outlet, and said D.C. electrical outlet being disposed side-by-side on a single surface of said housing.

2. The device according to claim 1 wherein said first external DC power source is a 12 volt DC power source and said second lower voltage DC power source is a 5 volt power source, said inverter circuit inverting said 12 volt power source to an alternating current power source and said converting circuitry converting said 12 power source to said 5 volt power source.

3. The device according to claim 2, wherein said first electrical connector is a male plug connector adapted to mate with a female socket of said external D.C. voltage source, said D.C. electrical outlet is a female socket correspondingly dimensioned to accommodate said male plug connector thereby mirroring said female socket of said external D.C. voltage source.

4. The device according to claim 2, wherein said first electrical connector is a male cigarette-type 12 volt plug connector adapted to mate with a female cigarette-type 12 volt socket of said external D.C. voltage source, said D.C. electrical outlet is a female cigarette-type 12 volt socket connector thereby mirroring said female cigarette-type 12 volt socket of said external D.C. voltage source.

5. The device according to claim 2, wherein said A.C. electrical outlet includes a plurality of A.C. electrical outlets.

6. The device according to claim 2, wherein said D.C. electrical outlet and said inverter circuitry are connected to said first electrical connector in parallel.

7. The device according to claim 6, wherein said circuit assembly includes a printed circuit board, said first electrical connector being electrically coupled to said printed circuit board and thereby establishing a connection from a positive and a ground line of said first external D.C. voltage source to corresponding leads of said printed circuit board, said corresponding leads of said printed circuit board each being electrically connected to each of said pass through D.C. electrical outlet and said inverting and converting circuitries thereby simultaneously providing power to each of said pass through D.C. electrical outlet, said A.C. electrical outlet, and said DC electrical outlet connected to said second lower DC power source.

8. The device according to claim 1, wherein said first electrical connector is a male plug connector adapted to mate with a female socket of said first external D.C. voltage source, wherein said housing and said entire multi source power converter device is supported solely by said male plug when mated with said female socket.

9. The device according to claim 8, further comprising an intake fan mounted to a bottom surface of said housing, said housing including a plurality of ventilation holes, said cooling fan and said ventilation holes allowing cooling air to enter and circulate within said housing thereby enhancing heat dissipation from the device.

10. The device according to claim 1, further comprising a map light disposed on an outer surface of said housing to provide illumination of an area adjacent said device.

11. The device according to claim 4, further comprising a map light disposed on an outer surface of said housing to provide illumination of an area adjacent said device.

12. The device according to claim 7, further comprising a map light disposed on an outer surface of said housing to provide illumination of an area adjacent said device.

13. The device according to claim 8, further comprising a map light disposed on an outer surface of said housing to provide illumination of an area adjacent said device.

14. A multi source hand held power converter device comprising:
   a compact hand holdable housing; said compact hand holdable housing in having;
      a first electrical connector for connecting said inverter to a first external D.C. voltage source;
      a circuit assembly supported within said housing and electrically coupled to said first electrical connector to facilitate a connection to said first external D.C. power source, said circuit assembly comprising an inverter circuit equipped with electrical components for inverting said first external D.C. voltage source to an A.C. voltage source and an additional converter circuit to convert said first external DC voltage source to a second lower voltage DC power source;
      an A.C. electrical outlet connected to said housing provided to facilitate a connection to an external A.C. power consuming device, said A.C. electrical outlet being powered by said A.C. voltage source when said first electrical connector is connected to said external D.C. power source; and
      a DC electrical outlet connected to facilitate a connection to an external DC power consuming device, said DC electrical outlet being connected to and powered by said second lower voltage DC power source from said converter circuit, wherein said A.C. electric outlet and said D.C. electrical outlet being disposed side-by-side on a single surface of said housing.

15. A multi source hand held power converter device comprising:
   a compact hand holdable housing; said compact hand holdable housing in having;
      a first electrical connector for connecting said inverter to a first external D.C. voltage source;
      a circuit assembly supported within said housing and electrically coupled to said first electrical connector to facilitate a connection to said first external D.C. power source, said circuit assembly comprising a converter circuit equipped with electrical components for converting said first external D.C. voltage source to a second lower voltage DC power source;
      a DC electrical outlet connected to facilitate a connection to an external DC power consuming device, said DC electrical outlet being connected to and powered by said second lower voltage DC power source from said converter circuitry; and
      a pass through device having a pass through D.C. electrical outlet to facilitate a connection to and providing said first external D.C. voltage source to an external D.C. power consuming device when said first electrical connector is connected to said external D.C. power source, wherein said A.C. electric outlet, said pass though D.C. electrical outlet, and said D.C. electrical outlet being disposed side-by-side on a single surface of said housing.

16. A multi source hand held power converter device comprising:
   a compact hand holdable housing; said compact hand holdable housing having;
      a first electrical connector for connecting said inverter to a first external D.C. voltage source;
      a circuit assembly supported within said housing and electrically coupled to said first electrical connector to facilitate a connection to said first external D.C. power source, said circuit assembly comprising an inverter circuit equipped with electrical components for inverting said first external D.C. voltage source to an A.C. voltage source and an additional converter circuitry to convert said first external DC voltage source to a second lower voltage DC power source;
      an A.C. electrical outlet connected to said housing provided to facilitate a connection to an external A.C. power consuming device, said A.C. electrical outlet being powered by said A.C. voltage source when said first electrical connector is connected to said external D.C. power source;
      a DC electrical outlet connected to facilitate a connection to an external DC power consuming device, said DC electrical outlet being connected to and powered by said second lower voltage DC power source from said converter circuitry; and
      a map light disposed on an outer surface of said housing to provide illumination of an area adjacent said device; wherein said first electrical connector is a male cigarette-type 12 volt plug connector adapted to mate with a female cigarette-type 12 volt socket of said external D.C. voltage source, wherein said compact hand holdable housing and said entire multi source power converter device is supported solely by said male cigarette-type 12 volt plug when mated with said female cigarette-type 12 volt socket of said external D.C. voltage source.

17. The multi source hand held power converter device according to claim 14 wherein said first electrical connector is a male cigarette-type 12 volt plug connector adapted to mate with a female cigarette-type 12 volt socket of said external D.C. voltage source, wherein said compact hand holdable housing and said entire multi source power converter device is supported solely by said male cigarette-type 12 volt plug when mated with said female cigarette-type 12 volt socket of said external D.C. voltage source.

18. The multi source hand held power converter device according to claim 14 wherein said first electrical connector is a male cigarette-type 12 volt plug connector adapted to mate with a female cigarette-type 12 volt socket of said external D.C. voltage source, wherein said compact hand holdable housing and said entire multi source power converter device is supported solely by said male cigarette-type 12 volt plug when mated with said female cigarette-type 12 volt socket of said external D.C. voltage source.

19. A power inverter comprising:
   a housing having a substantially flat bottom portion to rest on a surface, a substantially flat top portion opposite said flat bottom, and a pair of opposite side walls with at least one side wall being formed with parallel grooves extending a length of the housing, said parallel grooves being disposed adjacent to parallel ridges, said ridges and grooves being disposed side-by-side along an entire height of the housing to thereby define at least one side wall with a grooved configuration;
   a first electrical connector for connecting said inverter to an external D.C. voltage source;
   a circuit assembly supported within said housing and electrically coupled to said first electrical connector to facilitate a connection to said D.C. power source, said circuit assembly comprising an inverter circuit equipped wit electrical components for converting said external D.C. voltage source to an A.C. voltage source for consumption by an external A.C. power consuming device; an A.C. electrical outlet connected to said housing provided to facilitate a connection to said external A.C.

power consuming device, said A.C. electrical outlet being powered by said A.C. voltage source when said first electrical connector is connected to said external D.C. power source; and a pass though device having a D.C. electrical outlet to facilitate a connection to and providing a D.C. voltage source to an external D.C. power consuming device when said first electrical connector is connected to said external D.C. power source, wherein said A.C. electric outlet and said D.C. electrical outlet being disposed side-by-side on a single surface of said housing.

20. The inverter according to claim 19, wherein said first electrical connector is a male plug connector adapted to mate with a female socket of said external D.C. voltage source, said D.C. electrical outlet is a female socket correspondingly dimensioned to accommodate said male plug connector thereby mirroring said female socket of said external D.C. voltage source.

21. The inverter according to claim 19, wherein said first electrical connector is a male cigarette-type 12 volt plug connector adapted to mate with a female cigarette-type 12 volt socket of said external D.C. voltage source, said D.C. electrical outlet is a female cigarette-type 12 volt socket connector thereby mirroring said female cigarette-type 12 volt socket of said external D.C. voltage source.

22. The inverter according to claim 19, wherein said A.C. electrical outlet includes a plurality of A.C. electrical outlets.

23. The inverter according to claim 19, wherein said D.C. electrical outlet and said inverter circuitry are connected to said first electrical connector in parallel.

24. The inverter according to claim 19, further comprising a front end plate and a rear end plate secured to said housing in a manner so as to enclose said circuit assembly within said housing, wherein at least one of said front end plate and said rear end plate include a plurality of ventilation holes through which air can pass to and from the interior of the housing.

25. The inverter according to claim 23, wherein said circuit assembly includes a printed circuit board, said first electrical connector being electrically coupled to said printed circuit board and thereby establishing a connection from a positive and a ground line of said external D.C. voltage source to corresponding leads of said printed circuit board, said corresponding leads of said printed circuit board each being electrically connected to each of said D.C. electrical outlet and said inverter circuitry thereby simultaneously providing power to each of said D.C. electrical outlet and said A.C. electrical outlet.

26. The power inverter according to claim 24, further comprising an intake fan mounted to one of said front end plate and said rear end plate to intake cooling air and circulate air within the housing to increase heat dissipation from the heat sink plate to the air and then to the housing.

27. The power inverter according to claim 24, wherein said first electrical connector extends through a first one of said front end plate and said rear end plate, and said A.C. electrical outlet and said D.C. electrical outlet being mounted though a second one of said front end plate and said rear end plate.

28. A power inverter comprising:
a compact portable housing having a substantially flat bottom to rest on a surface, a flat top opposite said flat bottom, and a pair of opposite side walls formed with parallel grooves extending a length of the housing, said parallel grooves being disposed adjacent to parallel ridges, said ridges and grooves being disposed side-by-side along an entire height of the housing to thereby define opposite side walls with a grooved configuration;

a first electrical connector for connecting said inverter to an external D.C. voltage source;

a circuit assembly supported within said housing and electrically coupled to said first electrical connector to facilitate a connection to said D.C. power source, said circuit assembly comprising an inverter circuit equipped with electrical components for converting said external D.C. voltage source to an A.C. voltage source for consumption of an external A.C. power consuming device;

an A.C. electrical outlet connected to said housing provided to facilitate a connection to said external A.C. power consuming device, said A.C. electrical outlet being powered by said A.C. voltage source when said first electrical connector is connected to said external D.C. power source; and a pass through device having a D.C. electrical outlet to facilitate a connection to an external D.C. power consuming device that would otherwise be directly powered by said external D.C. power source when said first electrical connector is connected to said external D.C. power source and simultaneously providing a source of D.C. voltage substantially mirroring said external D.C. power source and to said external D.C. voltage power consuming device while said A.C. electrical outlet is powered by said A.C. voltage source and thereby simultaneously providing said A.C. voltage source to said external A.C. power consuming device.

29. The inverter according to claim 28, wherein said first electrical connector is a male plug connector adapted to mate with a female socket of said external D.C. voltage source, said D.C. electrical outlet is a female socket correspondingly dimensioned to accommodate said male plug connector thereby precisely mirroring said female socket of said external D.C. voltage source to provide a source of D.C. power to a device having an identical male plug connector.

30. The inverter according to claim 28, wherein said first electrical connector is a male cigarette-type 12 volt plug connector adapted to mate with a female cigarette-type 12 volt socket of said external D.C. voltage source, said D.C. electrical outlet is a female cigarette-type 12 volt socket connector thereby precisely minoring said female cigarette-type 12 volt socket of said external D.C. voltage source.

31. The inverter according to claim 28, wherein said D.C. electrical outlet and said inverter circuitry are connected to said first electrical connector in parallel.

32. The inverter according to claim 29, wherein said A.C. electrical outlet includes a plurality of A.C. electrical outlets.

33. The inverter according to claim 32, wherein said circuit assembly includes a printed circuit board, said first electrical connector being electrically coupled to said printed circuit board and thereby establishing a connection from a positive and a ground line of said external DC. voltage source to corresponding leads of said printed circuit board, said corresponding leads of said printed circuit board each being electrically connected to each of said D.C. electrical outlet and said inverter circuitry thereby simultaneously providing power to each of said D.C. electrical outlet and said A.C. electrical outlet.

34. The power inverter according to claim 29, further comprising a front end plate and a rear end plate secured to said housing in a manner so as to enclose said circuit assembly within said housing, wherein at least one of said front end plate and said rear end plate include a plurality of ventilation holes through which air can pass to and from the interior of the housing.

35. The power inverter according to claim 34, further comprising an intake fan mounted to one of said front end plate and said rear end plate to intake cooling air and circulate air within the housing to increase heat dissipation from the heat sink plate to the air and then to the housing.

36. The power inverter according to claim 34, wherein said first electrical connector extends through a first one of said front end plate and said rear end plate, and said A.C. electrical outlet and said D.C. electrical outlet being mounted through a second one of said front end plate and said rear end plate.

* * * * *